United States Patent [19]
Lee

[11] Patent Number: 6,124,615
[45] Date of Patent: Sep. 26, 2000

[54] STACKED SEMICONDUCTOR STRUCTURE FOR HIGH INTEGRATION OF AN INTEGRATED CIRCUIT WITH JUNCTION DEVICES

[75] Inventor: Jia-Sheng Lee, Hsinchu, Taiwan

[73] Assignee: United Microelectronics Corp., Hsinchu, Taiwan

[21] Appl. No.: 09/130,875

[22] Filed: Aug. 7, 1998

[30] Foreign Application Priority Data

May 4, 1998 [TW] Taiwan ................................. 87106836

[51] Int. Cl.$^7$ .................................................. H02L 29/00
[52] U.S. Cl. .......................... 257/349; 257/350; 257/351; 257/352; 257/353; 257/354; 257/355
[58] Field of Search ...................... 257/347–355

[56] References Cited

U.S. PATENT DOCUMENTS 5,359,219  10/1994  Hwang ..................................... 257/347
5,554,872  9/1996  Baba et al. .............................. 257/347

*Primary Examiner*—Fetsum Abraham
*Attorney, Agent, or Firm*—J. C. Patents; Jiawei Huang

[57] ABSTRACT

A stacked semiconductor structure is designed for component arrangement of an IC (integrated circuit) device having a large number of various types of junction devices, such as diodes, well resistors, N$^+$ resistors, and BJTs (bipolar junction transistors) and MOS (metal-oxide semiconductor) transistors. The stacked semiconductor structure is constructed on an SOI (silicon-on-insulator) structure which includes a semiconductor substrate; a buried insulator layer formed over the substrate; and a silicon film formed over the buried insulator layer. Based on this SOI structure, the various types of junction devices are arranged in the substrate beneath the buried insulator layer; while the MOS transistors are arranged in the silicon film above the buried insulator layer, with the silicon film further being further formed with a plurality of trenches for isolating the MOS transistors from each other. This stacked semiconductor structure can help reduce the bulk of these junction devices for high integration of the IC device while nonetheless providing proper isolations between the various junction devices and MOS transistors in the IC device.

23 Claims, 2 Drawing Sheets

STACKED SEMICONDUCTOR STRUCTURE FOR HIGH INTEGRATION OF AN INTEGRATED CIRCUIT WITH JUNCTION DEVICES

CROSS-REFERENCE TO RELATED APPLICATION

This application claims the priority benefit of Taiwan application serial no. 87106836, filed May 4, 1998, the full disclosure of which is incorporated herein by reference.

BACKGROUND OF THE INVENTION

1. Field of the Invention

This invention relates to semiconductor structures for integrated circuits (IC), and more particularly, to a stacked semiconductor structure for an IC device having a large number of junction devices, such as junction diodes, well resistors, $N^+$ resistors, and bipolar junction transistors (BJT), which can help reduce the bulk of these junction devices in the IC device for high integration.

2. Description of Related Art

In the design and fabrication of an IC device having a large number of junction devices, such as diodes, well resistors, $N^+$ resistors, and bipolar junction transistors (BJT), these junction devices typically require quite a large layout area on the wafer to realize. Therefore, the integration of the IC device is low.

Moreover, if these junction devices are to be formed in conjunction with a plurality of MOS (metal-oxide semiconductor) transistors on the same wafer, proper isolations have to be provided between these junction devices and the MOS transistors, or the undesired latch-up effect would occur and the operating voltage would be difficult to be controlled to the precise level.

SUMMARY OF THE INVENTION

It is an objective of the present invention to provide a stacked semiconductor structure, which allows junction devices and MOS transistors in an IC device to be arranged on a wafer in a stacked manner that can help increase the integration of the IC device.

It is another objective of the present invention to provide a stacked semiconductor structure, which allows junction devices and MOS transistors in an IC device to be properly isolated by means of an SOI (silicon-on-insulator) structure that helps improve the drawbacks of the latch-up effect and the unprecise operating voltage in the prior art.

In accordance with the foregoing and other objectives of the present invention, a stacked semiconductor structure is provided. The stacked semiconductor structure is designed specifically for use on an IC device having a large number of various types of junction devices and MOS transistors. The stacked semiconductor structure is based on an SOI (silicon-on-insulator) structure which is formed with a semiconductor substrate. A buried insulator layer (the insulator) is formed over the substrate, and a silicon film (the silicon) is formed over the buried insulator layer. In accordance with the invention, various types of junction devices are formed in the substrate beneath the buried insulator layer. Whereas, MOS transistors are formed in the silicon film above the buried insulator layer, with the silicon film further being formed with a plurality of trenches for isolating the MOS transistors from each other.

The stacked semiconductor structure further includes an inter-layer dielectric (ILD) layer formed over the silicon film, covering all the MOS transistors and the trenches formed in the silicon film; a metallization layer formed over the ILD layer; a plurality of contact plugs formed in the ILD layer for electrically connecting the metallization layer to the MOS transistors; and a passivation layer formed over the ILD layer and the metallization layer.

The various types of junction devices include, but not limited to, junction diodes, junction resistors, and BJTs.

Each junction diode can be either formed from the combination of a $P^+$ junction and an $N^+$ junction in a $P^-$ well, or from the combination of a $P^+$ junction and an $N^+$ junction in an $N^-$ well.

Each junction resistor can be either an $N^+$ resistor, a $P^+$ resistor, a $P^-$-well resistor, or an $N^-$-well resistor. The $N^+$ resistor is formed from an $N^+$ junction in a $P^-$ junction. The $P^+$ resistor is formed from a $P^+$ junction in an $N^-$ junction. The $P^-$-well resistor is formed from a $P^+$ junction in a $P^-$ junction. The $N^-$-well resistor is formed from an $N^+$ junction in an $N^-$ junction.

The various types of MOS transistors include an NMOS transistor and a PMOS transistor. Each NMOS transistor includes: a $P^-$ channel; an $N^-$ region formed on one side of the $P^-$ channel; an $N^+$ source/drain region formed on the other side of the $P^-$ channel; a gate oxide layer formed over the $P^-$ channel; and a gate electrode formed over the gate oxide layer. Each PMOS transistor includes: an $N^-$ channel; a $P^-$ region formed on one side of the $N^-$ channel; a $P^+$ source/drain region formed on the other side of the $N^-$ channel; a gate oxide layer formed over the $N^-$ channel; and a gate electrode formed over the gate oxide layer.

Further, In the SOI structure, the silicon film can be either an $N^-$-expitaxy film or a $P^-$-expitaxy film; the substrate can be either an $N^-$ substrate or a $P^-$ substrate; and the buried insulator layer is an oxide layer.

The foregoing stacked semiconductor structure can help reduce the bulk of these junction devices for high integration of the IC device while nonetheless providing proper isolations between the various junction devices and MOS transistors in the IC device.

DETAILED DESCRIPTION OF PREFERRED EMBODIMENTS

The invention is specifically designed for use on an IC device having a large number of various types of junction devices (such as diodes, well resistors, $N^+$ resistors, BJTs, and so on) and MOS transistors. In accordance with the invention, the SOI (silicon-on-insulator) technology is used in conjunction with the trench-isolation technology to allow proper isolation between the junction devices and the MOS transistors in the IC device.

Figure 1:
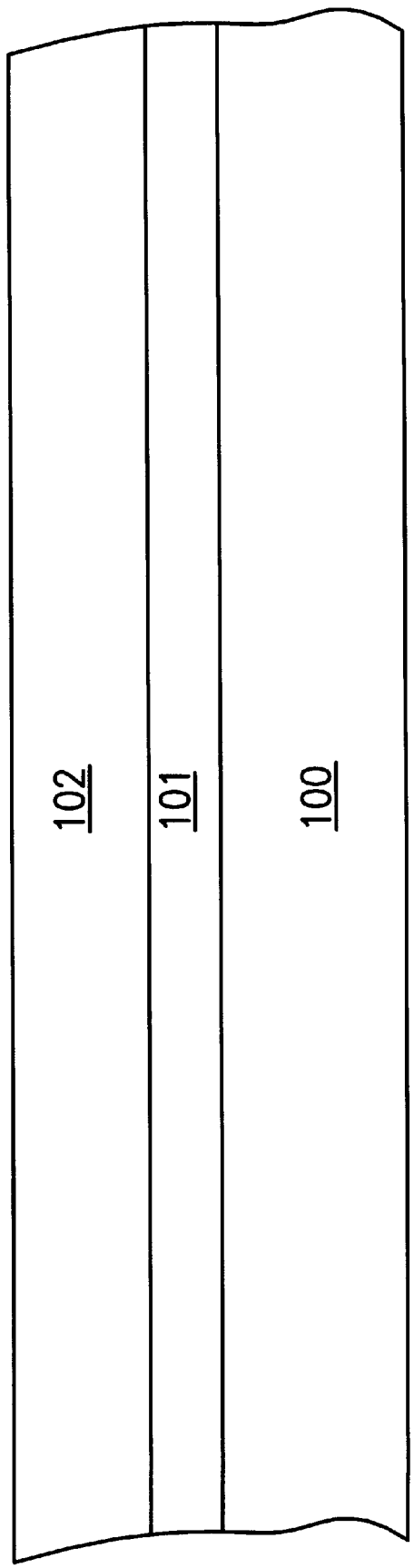
FIG. 1 is a schematic sectional diagram of an SOI structure on which the stacked semiconductor structure of the invention is constructed.

FIG. 1 is a schematic sectional diagram of an SOI structure on which the stacked semiconductor structure of the invention is constructed. As shown, the SOI structure is constructed on a semiconductor substrate 100, such as a silicon substrate 100, and includes a buried insulator layer 101 over the substrate 100 and a thin silicon film 102 over the buried insulator layer 101. The SOI structure is so named (i.e., silicon-on-insulator) due to the forming of the thin silicon film 102 (the silicon) over the buried insulator layer 101 (the insulator). The thin silicon film 102 can be either an $N^-$-expitaxy film or a $P^-$-expitaxy film. The substrate 100 can be either $N^-$-type or $P^-$-type.

In accordance with the invention, various types of junction devices and MOS transistors in the IC device are respectively formed on the two sides of the insulator layer in the SOI structure in a stacked manner so as to isolate the junction devices from the MOS transistors. Details of this structure is fully disclosed in the following with reference to FIG. 2.

Figure 2:
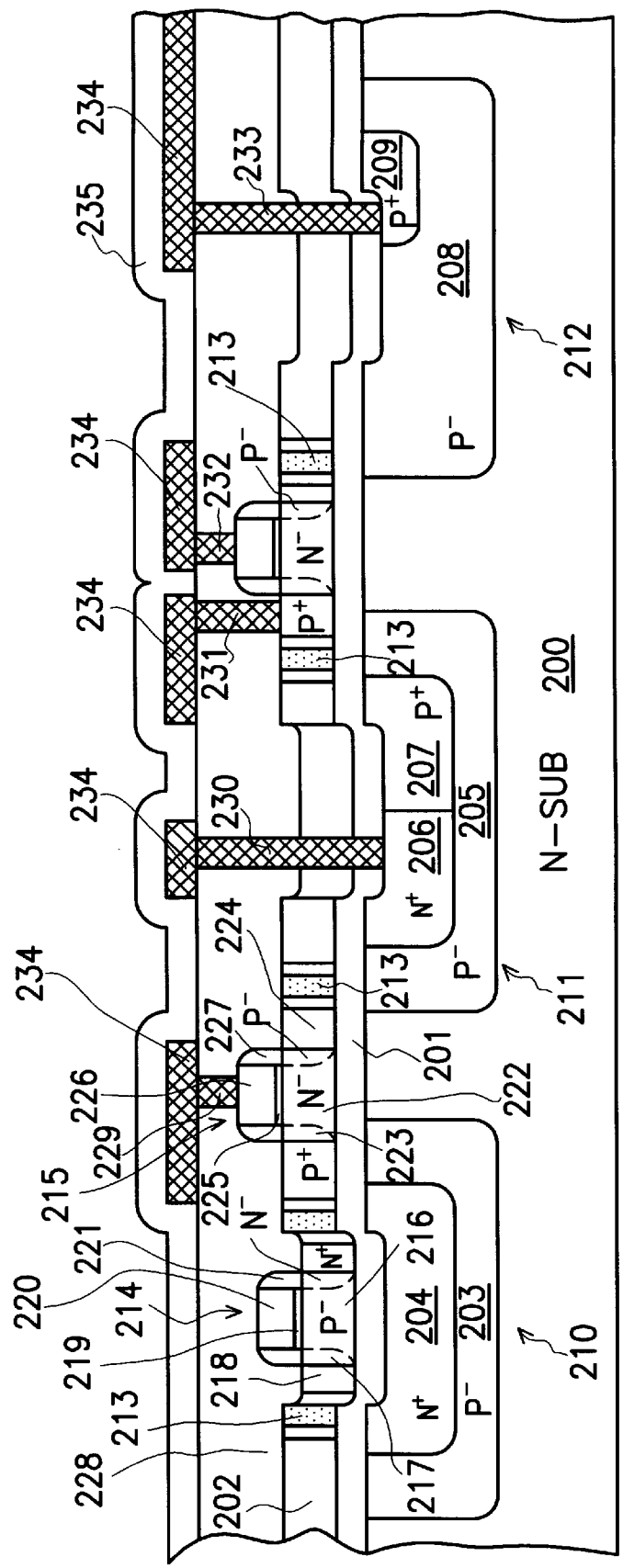
FIG. 2 is a schematic sectional diagram of an IC device which is constructed with the stacked semiconductor structure of the invention.

FIG. 2 is a schematic sectional diagram of an IC device which is constructed with the stacked semiconductor structure of the invention. In FIG. 2, the three elements of the SOI structure, i.e., the substrate, the buried insulator layer, and the silicon film, are respectively labeled with the reference numerals 200, 201, and 202.

In accordance with the invention, the $P^-$, $N^-$, $P^+$, and $N^+$ junctions are arranged in the substrate 200 beneath the buried insulator layer 201. These junctions can be used to form various semiconductor devices, such as diodes, resistors, and BJTs. For example, the $P^-$ junction 203 and the $N^+$ junction 204 in combination constitute an $N^+$ resistor 210; the $P^-$ junction 205, the $N^+$ junction 206, and the $P^+$ junction 207 in combination constitute a PN junction diode 211; while the $P^-$ junction 208 and the $P^+$ junction 209 in combination constitute a $P^-$-well resistor 212. The $P^-$ junctions 203, 205, 208 can be each, for example, a $P^-$-well. These junction structures are only illustrated for demonstrative purpose and not intended to limit the scope of the invention. In various other embodiments, the $N^+$ resistor 210 can be instead, for example, a $P^+$ resistor, while the $P^-$-wells can be $N^-$-wells instead.

In accordance with another embodiment of the invention, the MOS transistors in the IC device are arranged in the silicon film 202 above the buried insulator layer 201. The trench-isolation technique is used to form a plurality of trenches 213 to isolate neighboring MOS transistors, such as NMOS transistor 214 and PMOS transistor 215, from each other. The NMOS transistor 214 includes a $P^-$ channel 216; an $N^-$ region 217 formed on one side of the $P^-$ channel 216; an $N^+$ source/drain region 218 formed on the other side of the $P^-$ channel 216; a gate oxide layer 219 formed over the $P^-$ channel 216; and a gate electrode 220 formed over the gate oxide layer 219. The PMOS transistor 215 includes an $N^-$ channel 222; a $P^-$ region 223 formed on one side of the $N^-$ channel 222; a $P^+$ source/drain region 224 formed on the other side of the $N^-$ channel 222; a gate oxide layer 225 formed over the $N^-$ channel 222; and a gate electrode 226 formed over the gate oxide layer 225. Moreover, the NMOS transistor 214 includes a spacer 221 formed on the sidewall of the gate electrode 220; and similarly, the PMOS transistor 215 includes a spacer 227 formed on the sidewall of the gate electrode 226.

Furthermore, an inter-layer dielectric (ILD) layer 228 is formed over the silicon film 202, covering all of the MOS transistors. A plurality of contact plugs 229, 230, 231, 232, 233 are formed in the ILD layer 228 for electrically connecting the respective gate electrodes of the MOS transistors to a metallization layer 234 formed over the ILD layer 228. Finally, a passivation layer 235 is formed over the ILD layer 228 and the metallization layer 234.

From the foregoing description, it can be learned that the stacked semiconductor structure of the invention is based on an SOI structure consisting of the substrate 200, the buried insulator layer 201, and the silicon film 202, in which the various types of junction devices 210, 211, 212 and the MOS transistors 214, 215 are formed. The MOS transistors 214, 215 are further isolated by the trenches 213 formed in the silicon film 202. In the SOI structure, the buried insulator layer 201 can be an oxide layer; the silicon film 202 can be either $P^-$-expitaxy film or $N^-$-expitaxy film. The various types of junction devices include $N^-$ resistors, $P^+$ resistors, $N^-$-well resistors, $P^-$-well resistors, diodes, BJTs, and so on. In accordance with the invention, all of these junction devices are formed in the substrate 200 beneath the buried insulator layer 201; and the associated MOS transistors are formed in the silicon film 202 above the buried insulator layer 201 and further isolated by the trenches 213 formed in the silicon film 202.

In conclusion, the stacked semiconductor structure of the invention as disclosed above is designed specifically for component arrangement of an IC device having a large number of various types of junction devices (such as diodes, well resistors, $N^+$ resistors, and BJTs) and MOS transistors. The stacked semiconductor structure is constructed on an SOI structure which includes a semiconductor substrate; a buried insulator layer (the insulator) formed over the substrate; and a silicon film (the silicon) formed over the buried insulator layer. Based on this SOI structure, the various types of junction devices are arranged in the substrate beneath the buried insulator layer; while the MOS transistors are arranged in the silicon film above the buried insulator layer, with the silicon film further being formed with a plurality of trenches for isolating the MOS transistors from each other. This stacked semiconductor structure can help reduce the bulk of these junction devices for high integration of the IC device while nonetheless 1providing proper isolations between the various junction devices and MOS transistors in the IC device. The drawbacks of leakage current and latch-up effect as evident in the prior art are here improved. The invention is therefore more advantageous than the prior art.

The invention has been described using exemplary preferred embodiments. However, various modifications can be made based on the principles described above. For example, the present invention has been described based on a two-layer stacked structure. But the principles can be readily applied to multiple stacked structures, i.e., more than one layer of MOS transistors and junction devices can be formed in a stacked structure. It is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A stacked semiconductor structure, comprising:
   an SOI structure, including:
      a semiconductor substrate;
      a buried insulator layer formed over the substrate; and
      a silicon film formed over the buried insulator layer;
   a plurality of junction devices formed in the substrate beneath the buried insulator layer;
   a plurality of MOS transistors formed in the silicon film above the buried insulator layer, with the silicon film being further formed with a plurality of trenches for isolating the MOS transistors from each other;
   an ILD layer formed over the silicon film, covering all the MOS transistors and the trenches formed in the silicon film;

a metallization layer formed over the ILD layer;

a plurality of contact plugs formed in the ILD layer for electrically connecting the metallization layer to the MOS transistors; and a passivation layer formed over the ILD layer and the metallization layer.

2. The stacked semiconductor structure of claim 1, further comprising:

an ILD layer formed over the silicon film, covering all the MOS transistors and the trenches formed in the silicon film;

a metallization layer formed over the ILD layer;

a plurality of contact plugs formed in the ILD layer for electrically connecting the metallization layer to the MOS transistors; and a passivation layer formed over the ILD layer and the metallization layer.

3. The stacked semiconductor structure of claim 1, wherein the various types of junction devices include a junction diode, a junction resistor, and a BJT.

4. The stacked semiconductor structure of claim 3, wherein the junction diode is formed from the combination of a $P^+$ junction and an $N^+$ junction in a $P^-$ well.

5. The stacked semiconductor structure of claim 3, wherein the junction resistor is an $N^+$ resistor.

6. The stacked semiconductor structure of claim 5, wherein the $N^+$ resistor is formed from an $N^+$ junction in a $P^-$ junction.

7. The stacked semiconductor structure of claim 3, wherein the junction resistor is a $P^-$-well resistor.

8. The stacked semiconductor structure of claim 7, wherein the $P^-$-well resistor is formed from a $P^+$ junction in a $P^-$ junction.

9. The stacked semiconductor structure of claim 3, wherein the junction diode is formed from the combination of a $P^+$ junction and an $N^+$ junction in an $N^-$ well.

10. The stacked semiconductor structure of claim 3, wherein the junction resistor is a $P^+$ resistor.

11. The stacked semiconductor structure of claim 10, wherein the $P^+$ resistor is formed from a $P^+$ junction in an $N^-$ junction.

12. The stacked semiconductor structure of claim 3, wherein the junction resistor is an $N^-$-well resistor.

13. The stacked semiconductor structure of claim 12, wherein the $N^-$-well resistor is formed from an $N^+$ junction in an $N^-$ junction.

14. The stacked semiconductor structure of claim 1, wherein the various types of MOS transistors include an NMOS transistor and a PMOS transistor.

15. The stacked semiconductor structure of claim 14, wherein the NMOS transistor includes:

a $P^-$ channel;

an $N^-$ region formed on one side of the $P^-$ channel;

an $N^+$ source/drain region formed on the other side of the $P^-$ channel;

a gate oxide layer formed over the $P^-$ channel; and a gate electrode formed over the gate oxide layer.

16. The stacked semiconductor structure of claim 15, wherein the NMOS transistor further includes:

a spacer formed on the sidewall of the gate electrode.

17. The stacked semiconductor structure of claim 14, wherein the PMOS transistor includes:

an $N^-$ channel;

a $P^-$ region formed on one side of the $N^-$ channel;

a $P^+$ source/drain region formed on the other side of the $N^-$ channel;

a gate oxide layer formed over the $N^-$ channel; and a gate electrode formed over the gate oxide layer.

18. The stacked semiconductor structure of claim 17, wherein the PMOS transistor further includes:

a spacer formed on the sidewall of the gate electrode.

19. The stacked semiconductor structure of claim 1, wherein the silicon film in the SOI structure is an $N^-$-expitaxy film.

20. The stacked semiconductor structure of claim 1, wherein the silicon film in the SOI structure is a $P^-$-expitaxy film.

21. The stacked semiconductor structure of claim 1, wherein the substrate is an $N^-$ substrate.

22. The stacked semiconductor structure of claim 1, wherein the substrate is a $P^-$ substrate.

23. The stacked semiconductor structure of claim 1, wherein the buried insulator layer in the SOI structure is an oxide layer.

* * * * *